United States Patent
Dauelsberg

(10) Patent No.: US 6,932,866 B2
(45) Date of Patent: Aug. 23, 2005

(54) METHOD FOR DEPOSITING IN PARTICULAR CRYSTALLINE LAYERS

(75) Inventor: Martin Dauelsberg, Aachen (DE)

(73) Assignee: Aixtron AG (DE)

(*) Notice: Subject to any disclaimer, the term of this patent is extended or adjusted under 35 U.S.C. 154(b) by 260 days.

(21) Appl. No.: 10/601,507

(22) Filed: Jun. 23, 2003

(65) Prior Publication Data

US 2005/0011435 A1 Jan. 20, 2005

Related U.S. Application Data

(63) Continuation of application No. PCT/EP01/14064, filed on Dec. 1, 2001.

(51) Int. Cl.[7] ............................................. C30B 25/08
(52) U.S. Cl. ...................... 117/93; 117/98; 117/100; 117/101; 117/102; 117/107; 118/716
(58) Field of Search ............................ 117/93, 98, 100, 117/101, 102, 107; 118/716

(56) References Cited

U.S. PATENT DOCUMENTS

| | | | | |
|---|---|---|---|---|
| 4,615,294 A | * | 10/1986 | Scapple et al. ............. | 118/50.1 |
| 4,976,217 A | | 12/1990 | Frijlink ....................... | 118/733 |
| 5,027,746 A | | 7/1991 | Frijlink ....................... | 118/724 |
| 6,663,714 B2 | * | 12/2003 | Mizuno et al. ............. | 118/719 |

FOREIGN PATENT DOCUMENTS

| EP | WO 02/24985 | * | 3/2002 |
|---|---|---|---|
| EP | WO 02/27078 | * | 4/2002 |

* cited by examiner

Primary Examiner—Robert Kunemund
(74) Attorney, Agent, or Firm—St. Onge Steward Johnston & Reens LLC

(57) ABSTRACT

The invention relates to a method and a device for depositing especially crystalline layers on especially crystalline substrates in a process chamber of a reactor housing having a water-cooled wall. The floor of said process chamber is heated. At least one reaction gas as a process gas, and hydrogen as a carrier gas, are centrally introduced into the process chamber, and are extracted by a gas evacuation ring surrounding the process chamber. A flush gas flows between the cover of the reactor and the cover of the process chamber. Said flush gas and the flush gas which flushes the area between the reactor wall and the gas evacuation ring are introduced into the outer region of the process chamber, via a gap between the cover of the reactor and the gas evacuation ring which can be lowered for loading the process chamber, in order to be sucked through the openings in the gas evacuation ring with the process gas. The gas which flushes the region between the reactor wall and the gas evacuation ring is nitrogen or a mixture of hydrogen and nitrogen.

3 Claims, 1 Drawing Sheet

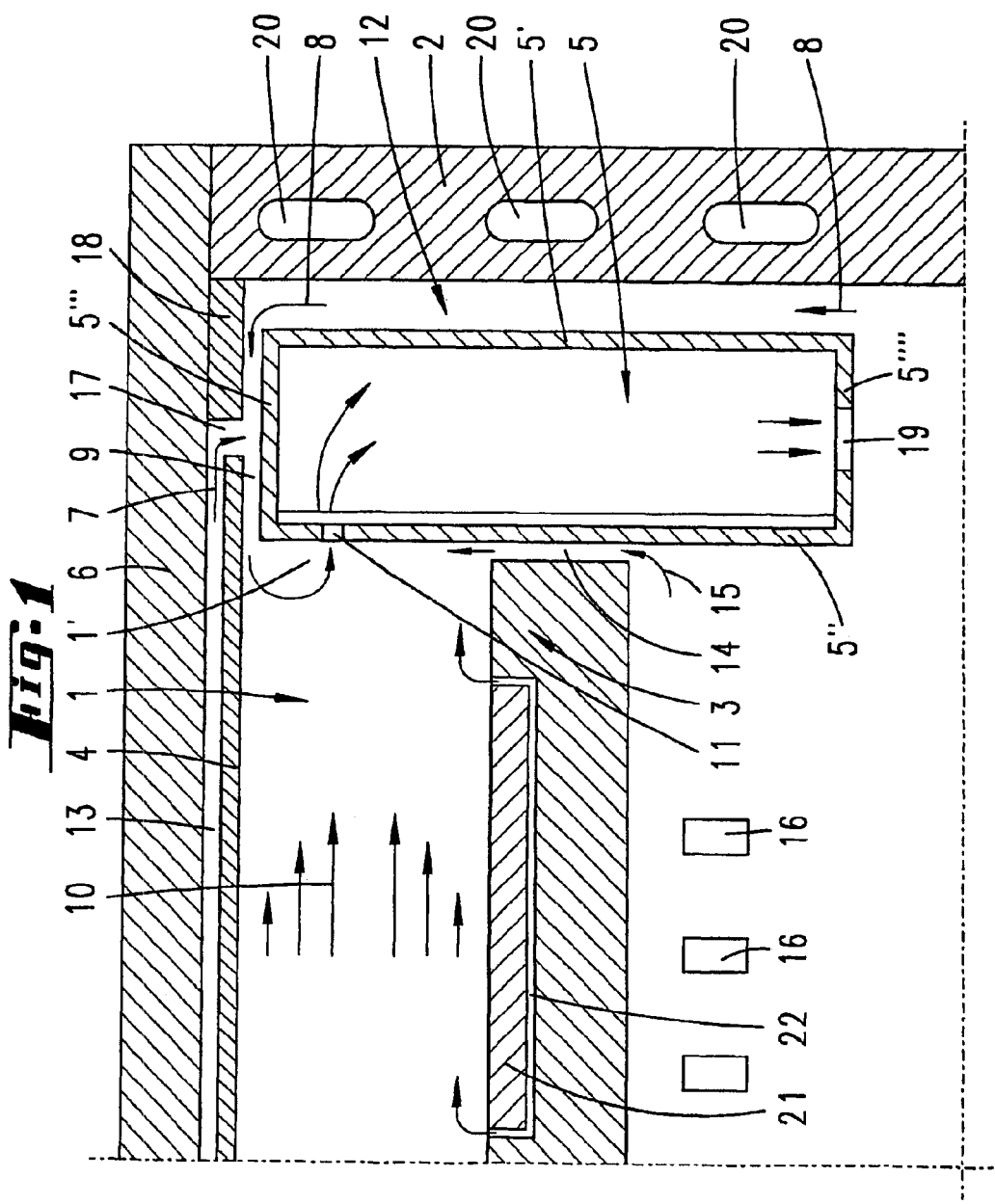

METHOD FOR DEPOSITING IN PARTICULAR CRYSTALLINE LAYERS

This application is a continuation of pending International Patent Application No. PCT/EP01/14064 filed Dec. 1, 2001, which designates the United States and claims priority of pending German Application No. 100 64 942 filed Dec. 23, 2000.

FIELD OF THE INVENTION

The invention relates to a method for depositing in particular crystalline layers on in particular crystalline substrates in a process chamber of a reactor housing with a water-cooled wall, the base of the process chamber being heated, and one or more reaction gases being introduced centrally into the process chamber as process gas, together with hydrogen as carrier gas, and being discharged through a gas outlet ring which surrounds the process chamber, a purge gas flowing between reactor cover and processing chamber ceiling, which purge gas, together with a purge gas which purges the space between reactor wall and gas outlet ring, is passed through a gap between reactor cover and the gas outlet ring, which can be lowered to allow loading of the process chamber, into the outer region of the process chamber, in order to escape into the gas outlet ring together with the process gas through openings.

BACKGROUND OF THE INVENTION

U.S. Pat. No. 4,976,217 describes a method and device for depositing III–V semiconductor layers in a reactor which is of cylinder-symmetrical form. The process chamber has a base which is heated by high frequency from below. The process chamber is surrounded by an annular hollow body which has radially inwardly directed openings through which the process gas, which is introduced centrally into the process chamber, is discharged. The rear, radially outer space around this gas outlet ring is surrounded by a cold reactor wall. The gap between the reactor wall and the gas outlet ring is purged by a purge gas.

U.S. Pat. No. 5,027,746 likewise describes a device for the epitaxial growth of II–V semiconductor layers. In this case too, the process gases are fed centrally to a process chamber, the base of which is heated. The process gases are discharged through a gas outlet ring which surrounds the process chamber. In this device too, gaps between the individual components of the process chamber are purged by means of purge gases. In this case, in particular, the space between the reactor cover and the process chamber ceiling is purged by a mixture of hydrogen and argon. The thermal conductivity of the purge gas, and therefore the cooling of the process chamber ceiling, can be influenced by varying the gas composition.

The device of the generic type has a gas outlet ring which is lowered in order for the process chamber to be loaded, for which purpose the reactor cover and the process chamber ceiling secured to it are raised. In the known device, in which the method of the generic type is carried out, undesirable particles may be released when the gas outlet ring is lowered. The particles are released in particular from the gas outlet openings of the gas outlet ring and originate from parasitic occupancy of the interior of the gas outlet ring.

The invention is based on the object of carrying out the method in such a way that this formation of particles is reduced.

The object is achieved by the invention described in the claims.

Claim 1 proposes that the gas which purges the space between the reactor wall and the gas outlet ring be nitrogen or a mixture of hydrogen and nitrogen. The solution according to the invention is based on the discovery that the parasitic growth inside the hollow gas outlet ring and in the region of the gap between gas outlet ring and that edge section of the process chamber ceiling which engages over the gas outlet ring in regions occurs as a result of a wall temperature which is too low and/or as a result of diffusion of a process gas into the gap. The purge gas selected not only reduces its thermal conductivity; rather, the measure proposed by Claim 1 is also associated with a change in the diffusion characteristics within the purge gas. On account of the reduced thermal conductivity, less heat is released by the radially outwardly facing wall of the gas outlet ring to the cooled reactor wall. The result of this is that the rear wall of the hollow interior of the gas outlet ring remains at a higher temperature than with the known procedure. Furthermore, the reduced diffusion counteracts the penetration of process gas into the gap between process chamber ceiling and gas outlet ring. The procedure according to the invention is advantageous in particular in processes in which substrates with a relatively large diameter, for example seven substrates each with a diameter of six inches are located in planetary form in the process chamber. The process chamber than has a relatively large diameter, making the gap between gas outlet ring and the water-cooled boundary wall of a standard reactor very small. The procedure according to the invention then leads to a correspondingly increased temperature gradient being present in the gap. Furthermore, it is beneficial if, in a known way, the gap space between the process chamber ceiling and the reactor cover is likewise purged with nitrogen or a mixture of hydrogen and nitrogen. This purge gas stream then passes through a gap between the edge of the process chamber ceiling and a spacer ring onto the outer wall, facing the process chamber ceiling, of the gas outlet ring. At this location, the gas which purges the cover gap is mixed with the gas which purges the boundary gap, with the result that the gas which flows into the periphery of the process chamber has an increased volumetric flow. The purge gas which flows into the periphery of the process chamber is sucked out together with the process gas through the gas exit openings of the gas outlet ring.

An exemplary embodiment of the invention is explained in more detail below with reference to appended drawings.

The drawing FIG. 1 represents a highly diagrammatic illustration of the periphery of a cylinder-symmetrical process chamber, in cross section.

The process chamber 1 extends horizontally above the process chamber base 3, which is heated from below by means of an HF heating means 16 and consists of graphite. In the process chamber base 3 there is a multiplicity of, in particular seven, cylindrical cutouts, in each of which a disk-like substrate holder 21 is mounted rotatably on a gas cushion 22. The process gas 10 flows through the process chamber 1, radially outward from its center. The process chamber 1 is delimited at the top by the process chamber ceiling 4, which may consist of quartz or may likewise consist of graphite. Between the process chamber ceiling 4 and the reactor cover 6, which consists of stainless steel, there is a gap 13 which is purged from the center outward by means of a purge gas 7.

The peripheral boundary of the process chamber 1 is formed by a gas outlet ring 5, which is formed as a hollow body. That wall 5" of the gas outlet ring 5 which faces toward the process chamber 1 has a multiplicity of openings 11 through which the process gas 10, together with the purge gas flowing into the periphery of the process chamber 1, is sucked out. The gas which has been sucked out emerges from the hollow interior of the gas outlet ring 5 through one or more gas exit openings 19 which are associated with the base-side wall 5''''. A pump may be connected to this opening 19.

To the rear of the gas outlet ring 5, between the rear wall 5' and the reactor wall 2, there is a narrow space 12. This space is purged by a purge gas 8. The purging takes place from the bottom upward, so that the purge gas 8 is diverted at a spacer ring 18, which is disposed in the corner region of the reactor and may consist of Ceran, in order to flow over the upper wall 5''' of the gas outlet ring 5.

Between the process chamber ceiling and the spacer ring 18 there is an annular gap 17, through which the purge gas 7 can escape, in order to mix with the purge gas 8 for the space 12 and to flow through the gap 9 between the upper wall 5''' and the edge section of the process chamber ceiling into the outer section 1' of the process chamber 1, where it is sucked out through the opening 11 together with a further purge gas stream 15 and the process gas 10. The purge gas 15 purges the gap 14 which is located between the peripheral edge of the process chamber base 3 and the inwardly facing wall 5'' of the gas outlet ring 5.

According to the invention, it is proposed for the space 12, which is only a few millimeters wide, between the wall 5' and the reactor wall 12, which includes purge water passages 20, to be purged by means of nitrogen or a mixture of hydrogen and nitrogen. This mixture has a significantly lower thermal conductivity than pure hydrogen, with the result that the wall 5' of the gas outlet ring 5, in particular on its inner side, remains at a temperature which is higher than the deposition temperature of the process gases, which may be phosphine, arsine and metalorganic compounds. The result of this is that no deposition or only a small amount of deposition occurs in the hollow interior of the gas outlet ring. If the gas outlet ring 5 is lowered in order for the process chamber 1 to be loaded with substrates, therefore, it is impossible for any particles to escape outward from the interior of the gas outlet ring 5 through the openings 11.

Moreover, the fact that the hydrogen/nitrogen gas stream also purges the gap 9 between reactor ceiling 4 and gas outlet ring 5 effectively prevents process gas from diffusing into the gap 9, where it could condense at cold locations. If the gas stream 7, which likewise consists of a mixture of hydrogen and nitrogen, is admixed with this gas stream, the diffusion properties are reduced still further.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Method for depositing in particular crystalline layers on in particular crystalline substrates in a process chamber (1) of a reactor housing with a water-cooled wall (2), the base (3) of the process chamber (1) being heated, and one or more reaction gases being introduced centrally into the process chamber (1) as process gas, together with hydrogen as carrier gas, and being discharged through a gas outlet ring (5) which surrounds the process chamber (1), a purge gas (7) flowing between reactor cover (6) and processing chamber ceiling (4), which purge gas (7), together with a purge gas (8) which purges the space (12) between reactor wall (2) and gas outlet ring (5), is passed through a gap (9) between reactor ceiling (4) and the gas outlet ring (5), which can be lowered to allow loading of the process chamber (1), into the outer region (1') of the process chamber (1), in order to be sucked into the gas outlet ring (54) together with the process gas (10) through openings (11), the gas which purges the space (12) between reactor wall (2) and gas outlet ring (5) being nitrogen or a mixture of hydrogen and nitrogen.

2. Device for depositing in particular crystalline layers on in particular crystalline substrates in a process chamber (1) of a reactor housing with a water-cooled wall (2), the base (3) of the process chamber (1) being heated, and one or more reaction gases being introduced centrally into the process chamber (1) as process gas, together with hydrogen as carrier gas, and being discharged through a gas outlet ring (5) which surrounds the process chamber (1), a purge gas (7) flowing between reactor cover (6) and processing chamber ceiling (4), which purge gas (7), together with a purge gas (8) which purges the space (12) between reactor wall (2) and gas outlet ring (5), is passed through a gap (9) between reactor ceiling (4) and the gas outlet ring (5), which can be lowered to allow loading of the process chamber (1), into the outer region (1') of the process chamber (1), in order to pass into the gas outlet ring (54) together with the process gas (10) through openings (11), the gas which purges the space (12) between reactor wall (2) and gas outlet ring (5) being nitrogen or a mixture of hydrogen and nitrogen.

3. Method according to claim 1 or device according to claim 2, characterized in that the gas (7) which purges the gap (13) between reactor cover (6) and process chamber ceiling (4) is likewise nitrogen or a mixture of hydrogen and nitrogen.

* * * * *